US012757567B2

(12) United States Patent
Park et al.

(10) Patent No.: US 12,757,567 B2
(45) Date of Patent: Oct. 6, 2026

(54) LIGHT-EMITTING DEVICE AND LIGHT-EMITTING DISPLAY DEVICE INCLUDING THE SAME

(71) Applicant: LG Display Co., Ltd., Seoul (KR)

(72) Inventors: Jin Hwan Park, Paju-si (KR); Ji Yun Kim, Paju-si (KR); Yong Hwan Kim, Paju-si (KR); Tae Shick Kim, Paju-si (KR); Kwang Hyun Kim, Paju-si (KR); Dong Hyuk Kim, Paju-si (KR)

(73) Assignee: LG DISPLAY CO., LTD., Seoul (KR)

(*) Notice: Subject to any disclaimer, the term of this patent is extended or adjusted under 35 U.S.C. 154(b) by 892 days.

(21) Appl. No.: 18/086,298

(22) Filed: Dec. 21, 2022

(65) Prior Publication Data

US 2023/0217670 A1 Jul. 6, 2023

(30) Foreign Application Priority Data

Dec. 31, 2021 (KR) ........................ 10-2021-0194782

(51) Int. Cl.
*H10K 50/13* (2023.01)
*H10K 50/15* (2023.01)
*H10K 50/16* (2023.01)
*H10K 59/12* (2023.01)

(52) U.S. Cl.
CPC ............. *H10K 50/13* (2023.02); *H10K 50/15* (2023.02); *H10K 50/16* (2023.02); *H10K 59/12* (2023.02)

(58) Field of Classification Search
CPC ...................................................... H01K 50/13
See application file for complete search history.

(56) References Cited

U.S. PATENT DOCUMENTS

| | | | | |
|---|---|---|---|---|
| 2018/0061901 A1* | 3/2018 | Zhang | .................... | H10K 50/82 |
| 2022/0029100 A1 | 1/2022 | You et al. | | |

FOREIGN PATENT DOCUMENTS

| | | | |
|---|---|---|---|
| CN | 106972111 | A | 7/2017 |
| CN | 111430562 | A | 7/2020 |
| CN | 111799386 | A | 10/2020 |
| JP | 2008-91198 | A | 4/2008 |

(Continued)

OTHER PUBLICATIONS

Liu et al., "Improved Efficiency Roll-Off and Operational Lifetime of Organic Light-Emitting Diodes with a Tetradentate Platinum(II) Complex by Using an n-Doped Electron-Transporting Layer", Molecules, vol. 26, No. 1835, 2021 (Published Mar. 24, 2021), pp. 1-10.

*Primary Examiner* — Chanceity N Robinson
(74) *Attorney, Agent, or Firm* — Birch, Stewart, Kolasch & Birch, LLP

(57) ABSTRACT

A light-emitting device can include a first light-emitting layer so that a dopant having a hole trapping property is adjacent to a hole transport layer, and a second light-emitting layer that comes into contact with the first light-emitting layer to induce main light emission, thereby widening an emission zone and improving the efficiency and lifespan of the light-emitting layer. Also, a light-emitting display can include the light-emitting device. The first and second blue light-emitting layers can include a same host BH and different first and second blue dopants, respectively, and the first blue dopant can have a higher highest occupied molecular orbital (HOMO) energy level than a HOMO energy level of the hole transport layer.

18 Claims, 12 Drawing Sheets

(56) References Cited

FOREIGN PATENT DOCUMENTS

| | | | | |
|---|---|---|---|---|
| JP | 2012-221902 | A | 11/2012 | |
| JP | 2015-156388 | A | 8/2015 | |
| KR | 10-2014-0042351 | A | 4/2014 | |
| KR | 10-1429537 | B1 | 8/2014 | |
| KR | 10-2018-0047546 | A | 5/2018 | |
| KR | 10-2019-0024398 | A | 3/2019 | |
| KR | 10-2021-0076759 | A | 6/2021 | |
| WO | WO-2012141107 | A1 * | 10/2012 | ............. H10K 50/19 |

* cited by examiner

LIGHT-EMITTING DEVICE AND LIGHT-EMITTING DISPLAY DEVICE INCLUDING THE SAME

CROSS-REFERENCE TO RELATED APPLICATIONS

This application claims priority to Korean Patent Application No. 10-2021-0194782, filed in the Republic of Korea on Dec. 31, 2021, the entire contents of which are hereby expressly incorporated by reference into the present application.

BACKGROUND OF THE DISCLOSURE

Field

The present disclosure relates to a light-emitting device and a light-emitting display including the light-emitting device.

Discussion of the Related Art

Recently, a light-emitting display that does not require a separate light source has come into wider use. The light-emitting display has a light-emitting device in a display panel without a separate light source to make the display compact and realize clear color.

Light-emitting devices currently used in light-emitting displays require higher efficiency in order to realize excellent image quality.

Meanwhile, a tandem device in which light-emitting layers emitting light of different colors provided in different stacks has come into use as a light-emitting device.

However, since different color light-emitting layers have different efficiencies based on materials and human visibility for each color, research has been conducted on different color light-emitting layers having low visibility and low efficiency to improve visibility and efficiency.

SUMMARY OF THE DISCLOSURE

Accordingly, the present disclosure is directed to a light-emitting device and a light-emitting display including the same that substantially obviate one or more issues due to limitations and disadvantages of the related art.

A tandem light-emitting device using a plurality of stacks has a difference in efficiency between stacks emitting light of different colors and requires higher blue efficiency from the viewpoint of color temperature.

A method of increasing a carrier transport effect by changing the material for the transport layer adjacent to the light-emitting layer is considered in order to increase the efficiency of a blue stack emitting blue light. However, this method can cause a limitation in that the lifespan is reduced due to the formation of a narrow light-emitting region in the light-emitting layer.

A light-emitting device and a light-emitting display according to one or more embodiments of the present disclosure are devised to address this and other limitations associated with the related art, whereby an emission zone can be increased, efficiency can be improved, and lifespan can be improved by changing the structure of the blue light-emitting layer.

Additional advantages, objects, and features of the disclosure will be set forth in part in the description which follows and in part will become apparent to those having ordinary skill in the art upon examination of the following, or can be learned from practice of the disclosure. The objectives and other advantages of the disclosure can be realized and attained by the structure particularly pointed out in the written description and claims hereof as well as the appended drawings.

To achieve these objects and other advantages and in accordance with the purpose of the disclosure, as embodied and broadly described herein, a light-emitting device can include a first light emitting layer including a first dopant having a hole trapping property so as to be adjacent to a hole transport layer, and a second light emitting layer having main light emission in contact with the first light emitting layer. So the light-emitting device according to the disclosure can widen an emission zone and improve both luminous efficiency and lifespan.

In accordance with one embodiment of the present disclosure, a light-emitting device can include a first electrode and a second electrode facing each other over a substrate, and a first blue stack, a first charge generation layer, and a phosphorescent stack between the first electrode and the second electrode, wherein the first blue stack sequentially includes a hole transport layer, a first blue light-emitting layer, a second blue light-emitting layer, and an electron transport layer, the first and second blue light-emitting layers include the same host and include different first and second blue dopants, respectively, and the first blue dopant has a higher highest occupied molecular orbital (HOMO) energy level than a HOMO energy level of the hole transport layer.

In accordance with another aspect of the present disclosure, a light-emitting device includes a first electrode and a second electrode facing each other over a substrate, and a first blue stack, a first charge generation layer, a phosphorescent stack and a second blue stack between the first electrode and the second electrode, wherein the first blue stack sequentially includes a first hole transport layer, a first blue light-emitting unit, and a first electron transport layer, the second blue stack sequentially includes a second hole transport layer, a second blue light-emitting unit, and a second electron transport layer, at least one of the first and second blue light-emitting units includes first and second blue light-emitting layers, and the first and second blue light-emitting layers include the same host BH and comprise different first and second blue dopants, respectively, and the first blue dopant has a higher HOMO energy level than a HOMO energy level of the first hole transport layer or the second hole transport layer.

In accordance with another aspect of the present disclosure, a light-emitting display device includes a substrate including a plurality of subpixels, a thin film transistor provided in each of the subpixels on the substrate, and the light-emitting device connected to the thin film transistor in at least one of the subpixels.

In accordance with another aspect of the present disclosure, a light-emitting device includes a first electrode and a second electrode facing each other over a substrate; and a first blue stack, a first charge generation layer, and a phosphorescent stack between the first electrode and the second electrode, wherein, the first blue stack sequentially comprises a hole transport layer, a first blue light-emitting layer, a second blue light-emitting layer, and an electron transport layer, a main emission of a blue light is emitted from a region including an interface between the first blue light-emitting layer and the second blue light-emitting layer, and an auxiliary emission of the blue light is emitted from a region in the first blue light-emitting layer.

It is to be understood that both the foregoing general description and the following detailed description of the present disclosure are by example and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this application, illustrate embodiment(s) of the disclosure and together with the description serve to explain the principle of the disclosure. In the drawings.

DETAILED DESCRIPTION OF THE EMBODIMENTS

Figure 1:
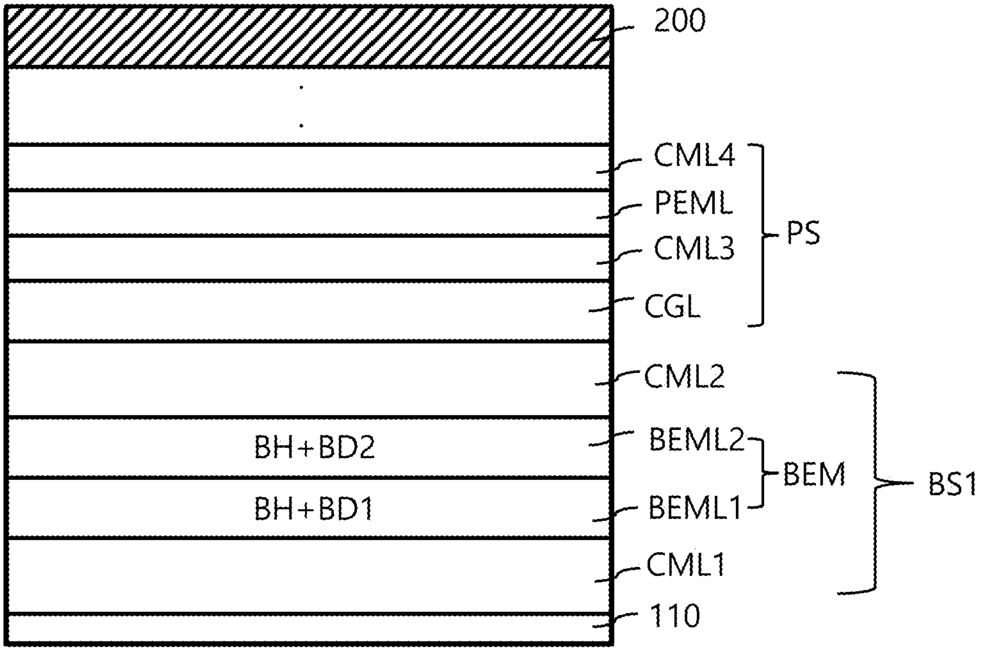
FIG. 1 is a cross-sectional view illustrating a light-emitting device according to a first embodiment of the present disclosure.

Reference will now be made in detail to embodiments of the present disclosure, examples of which are illustrated in the accompanying drawings. Wherever possible, the same reference numbers will be used throughout the drawings to refer to the same or like parts. In the following description of the present disclosure, detailed descriptions of known functions and configurations incorporated herein may be omitted or may be provided briefly when the same can obscure the subject matter of the present disclosure. In addition, the names of elements used in the following description are selected in consideration of clarity of description of the specification, and can differ from the names of elements of actual products.

In the drawings for explaining the example aspects of the present disclosure, for example, the illustrated shape, size, ratio, angle, and number are given by way of example, and thus, are not limited to the disclosure of the present disclosure. Throughout the present specification, the same reference numerals designate the same constituent elements. In addition, in the following description of the present disclosure, a detailed description of known functions and configurations incorporated herein will be omitted or may be provided briefly when it can make the subject matter of the present disclosure rather unclear. The terms “comprises,” “includes,” and/or “has”, used in this specification, do not preclude the presence or addition of other elements unless used along with the term “only”. The singular forms are intended to include the plural forms as well, unless the context clearly indicates otherwise.

In the interpretation of constituent elements included in the various aspects of the present disclosure, the constituent elements are interpreted as including an error range even if there is no explicit description thereof.

In the description of the various aspects of the present disclosure, when describing positional relationships, for example, when the positional relationship between two parts is described using “on”, “above”, “below”, “next to”, or the like, one or more other parts can be located between the two parts unless the term “directly” or “closely” is used.

In the description of the various aspects of the present disclosure, when describing temporal relationships, for example, when the temporal relationship between two actions is described using “after”, “subsequently”, “next”, “before”, or the like, the actions may not occur in succession unless the term “directly” or “just” is used therewith.

In the description of the various aspects of the present disclosure, although terms such as, for example, “first” and “second” can be used to describe various elements, these terms are merely used to distinguish the same or similar elements from each other. Therefore, in the present specification, an element indicated by “first” can be the same as an element indicated by “second” without exceeding the technical scope of the present disclosure, unless otherwise mentioned.

The respective features of the various aspects of the present disclosure can be partially or wholly coupled to and combined with each other, and various technical linkages and modes of operation thereof are possible. These various aspects can be performed independently of each other, or can be performed in association with each other.

In the following description of the various embodiments, a “doped” layer refers to a layer containing a host material and a dopant material that has properties different from the host material. Examples of host and dopant materials can include an N-type material and a P-type material or an organic material and an inorganic material. Apart from the differences in properties, the host and dopant materials can also differ in terms of their amounts in the doped layer. For example, the host material can be a major component while the dopant material can be a minor component. In some embodiments, an amount of dopant material is less than 30 wt %, based on a total weight of the doped layer.

In some embodiments, a layer can be made from organic materials only, which can include N-type and P-type materials. When the amount of the N-type material is less than 30 wt % or the content of the P-type material is less than 30 wt %, the layer can be a “doped” layer.

The term “undoped” describes layers that are not “doped.” For example, a layer can be an “undoped” layer when it is formed of a single material or a mix of materials having the same or similar properties. As a further example, a layer can be an "undoped" layer when at least one of materials forming a layer is P-type and none of the materials forming the layer is N-type. As another example, a layer can be an "undoped" layer when at least one of the materials forming a layer is organic and none of the materials forming the layer is inorganic.

Advantages and features of the present disclosure and methods of achieving the same will be more clearly understood from embodiments described below with reference to the accompanying drawings. However, the present disclosure is not limited to the following embodiments and can be implemented in various different forms. The embodiments are provided merely to complete the disclosure of the present disclosure and to fully inform a person having ordinary skill in the art to which the present disclosure pertains of the category of the present disclosure.

Figure 2:
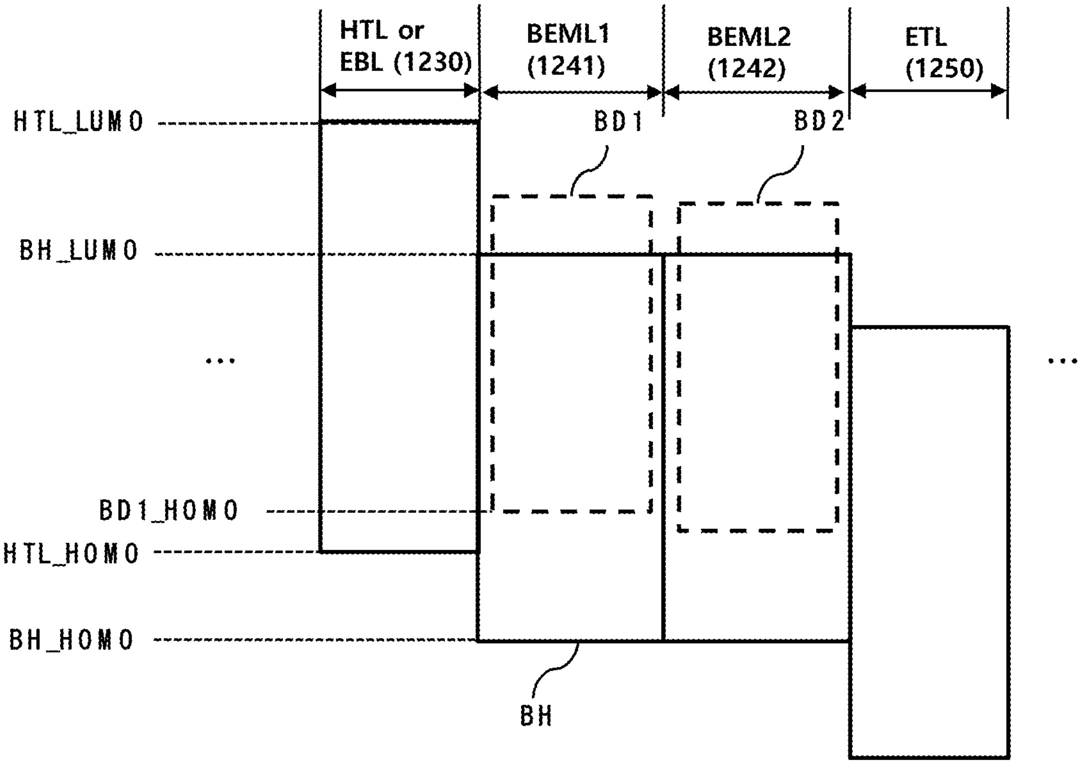
FIG. 2 is an energy band diagram of a blue light-emitting unit and a peripheral layer of FIG. 1.
Figure 3:
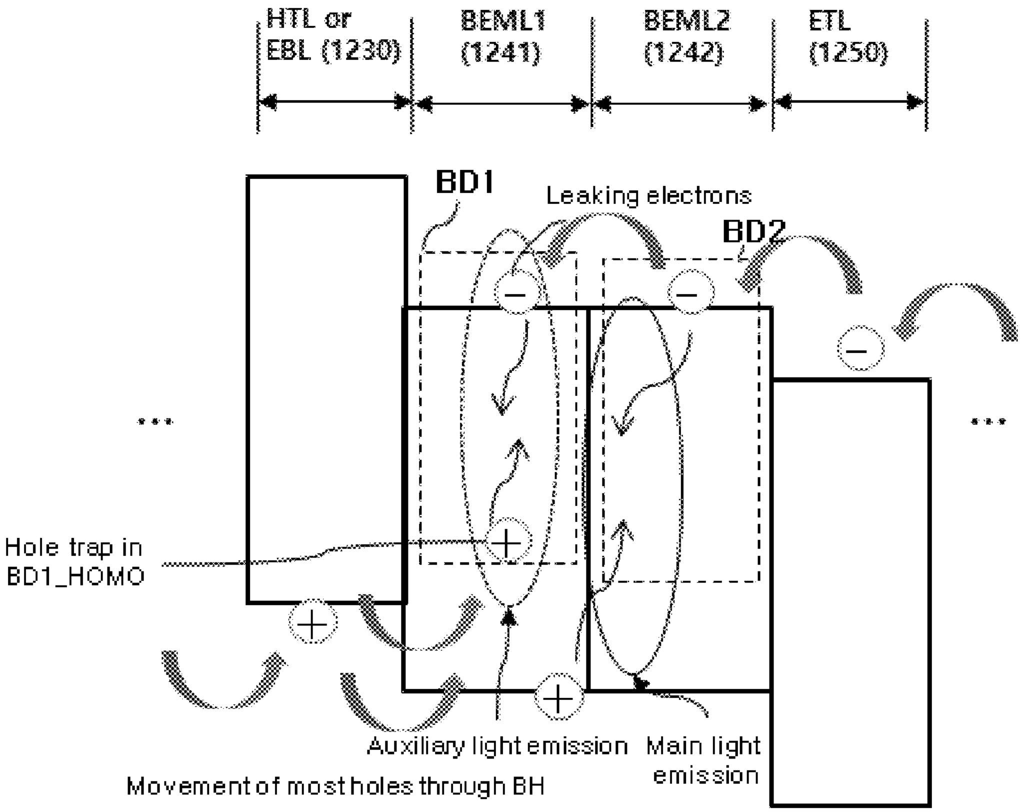
FIG. 3 illustrates main light emission and auxiliary light emission generated in the blue light-emitting unit of FIG. 2.
Figure 4:
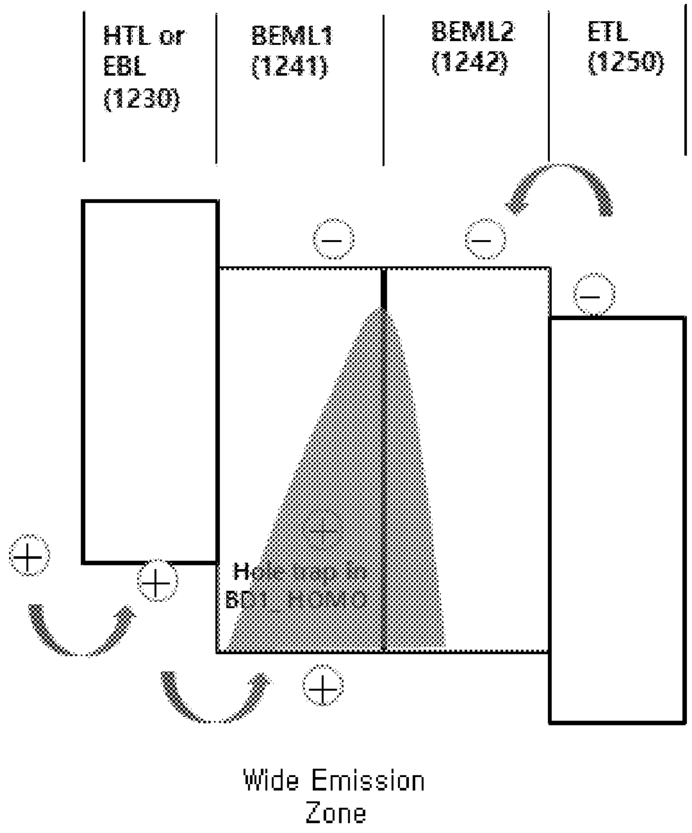
FIG. 4 illustrates an emission zone provided in the blue light-emitting unit of FIG. 2.

FIG. 1 is a cross-sectional view illustrating a light-emitting device according to a first embodiment of the present disclosure, and FIG. 2 is an energy band diagram of a blue light-emitting unit and a peripheral layer of FIG. 1. In addition, FIG. 3 illustrates main light emission and auxiliary light emission generated in the blue light-emitting unit of FIG. 2, and FIG. 4 illustrates an emission zone provided in the blue light-emitting unit of FIG. 2.

As shown in FIG. 1, the light-emitting device according to the first embodiment of the present disclosure can include a first electrode 110 and a second electrode 200 facing each other, and a first blue stack BS1, a first charge generation layer CGL, and a phosphorescent stack PS between the first electrode 110 and the second electrode 200. Other layers can also be included. All components of each light-emitting device according to all embodiments of the present disclosure are operatively coupled and configured.

The light-emitting device of the present disclosure can include a plurality of stacks between the first and second electrodes 110 and 200, and emits white light by combination of colors of light emitted from the plurality of stacks. White light can be realized by combination of the first blue stack BS1 with the phosphorescent stack PS shown in FIG. 1 as a minimal configuration of the light-emitting device. When the light-emitting device has a minimal stack configuration, the phosphorescent stack PS can contact the second electrode 200.

The light-emitting device can further include an additional stack between the phosphorescent stack PS and the second electrode 200, between the first electrode 110 and the second electrode 200, to express more diverse or different colors. The additional stack can be a second blue stack that is different from or the same as that of the first blue stack BS1, or a stack emitting light with other color. Accordingly, additional stacks of different colors can be provided to fine tune the desired color to be emitted, while additional stacks of the same colors can be provided to emit light of a greater intensity of the same color.

Here, one of the first electrode 110 and the second electrode 200 can be an anode and the other can be a cathode. When the light-emitting device is applied to a light-emitting display device, the first electrode 110 can be disposed close to the substrate, or the second electrode 200 can be disposed close to the substrate in an inverted form of the structure shown in FIG. 1. One of the first and second electrodes 110 and 200 can be a reflective electrode and the other can be a transparent electrode or a reflective and transmissive electrode. The reflective electrode is, for example, at least one metal selected from Al, Ag, and Mg, or an alloy containing at least one of Al, Ag, and Mg. Other metals or materials can be used for the reflective electrode. The reflective and transmissive electrode can include a metal of the same type as that of the reflective electrode and/or have a small thickness of 200 Å or less, allowing light having a microcavity characteristic to be transmitted. Meanwhile, examples of the transparent electrode can include indium tin oxide (ITO), indium zinc oxide (IZO), indium tin zinc oxide (ITZO) and the like. Other inorganic materials can be used for the transparent electrode.

The first blue stack BS1 comes into contact with the first electrode 100 and includes a first blue light-emitting unit BEM1 at the center, a first common layer CML1 in a lower part and a second common layer CML2 in an upper part.

The first common layer CML1 is a layer related to hole injection and generation, and can include a hole injection layer, a hole transport layer, and an electron blocking layer. Other layers can be included.

The second common layer CML2 is a layer related to electron transport and control, and can include an electron transport layer. Other layers can also be included.

The phosphorescent stack PS can include at least one phosphorescent light-emitting layer PEML, and can include a third common layer CML3 and a fourth common layer CML4 in a lower portion and an upper portion, respectively.

The third common layer CML3 is a layer related to hole generation and can include a hole transport layer and an electron blocking layer. Other layers can also be included.

The fourth common layer CML4 is a layer related to electron transport and control, and can include an electron transport layer. When the light-emitting device includes only two stacks of the first blue stack BS1 and the phosphorescent stack PS, the fourth common layer CML4 can include an electron injection layer as a layer in contact with the second electrode 200.

More specifically, as shown in FIGS. 2 to 4, the first blue stack BS1 includes a hole transport layer 1230, a first blue light-emitting layer 1241, a second blue light-emitting layer 1242, and an electron transport layer 1250 in this order. For example, the first blue light-emitting layer 1241 and the second blue light-emitting layer 1242 constitute the blue light-emitting unit BEM, and both layers 1241, 1242 can emit blue light. The first blue light-emitting layer 1241 and the second blue light-emitting layer 1242 can include other layers.

In the following description, the hole transport layer 1230 in contact with the first blue light-emitting layer 1241 is a layer related to hole transport. The hole transport layer 1230 can be a known arylene-based hole transport layer. In the light-emitting device of the present disclosure, the hole transport layer 1230 can be formed using a material having a higher LUMO energy than the LUMO energy level (BH_LUMO) of the host BH provided in the blue light-emitting unit BEM to prevent electrons from moving from the adjacent blue light-emitting unit BEM. In consideration thereof, the hole transport layer 1230 in contact with the first blue light-emitting layer 1241 is also referred to as an "electron blocking layer". In some cases, the hole transport layer can have a multilayered structure in which a hole transport layer such as an arylene-based NPD is disposed on the far side from the first blue light-emitting layer 1241, and an electron blocking layer such as TAPC is disposed on the side in contact with the first blue light-emitting layer 1241.

Meanwhile, the hole transport layer 1230 of the present disclosure can function to transport holes and to block electrons, which is possible based on the difference in energy band gap with the adjacent first blue light-emitting layer 1241, and the material therefor is not limited to those described above.

The first and second blue light-emitting layers 1241 and 1242 can include the same host BH and can include different first and second blue dopants BD1 and BD2, respectively. As shown in FIG. 2, the HOMO energy level BD1_HOMO of the blue dopant BD1 is higher than the highest occupied molecular orbital (HOMO) energy level HTL_HOMO of the hole transport layer 1240. The first blue dopant BD1 in the first blue light-emitting layer 1241 has a higher HOMO energy level (BD1_HOMO) than the HOMO energy level (HTL_HOMO) of the hole transport layer 1230, and thus can trap the holes transported from the hole transport layer 1230, and the holes trapped by the first blue dopant BD1 can react with electrons transported from the second blue light-emitting layer 1242 rather than being used to generate excitons to cause auxiliary light emission. The blue dopants used for the first and second blue light-emitting layers 1241 and 1242 can be other dopants or a combination of dopants as long as the used dopant is able to provide the hole trapping property to the first blue light-emitting layers 1241 and the HOMO energy level of a blue dopant of the first blue light-emitting layers 1241 is lower than the HOMO energy level of a blue dopant of the second blue light-emitting layers 1241.

In this case, FIG. 3 shows that auxiliary light emission occurs in the first blue light-emitting layer 1241, whereas main light emission occurs at the interface between the first and second blue light-emitting layers 1241 and 1242. This is because light emission of the blue light-emitting unit BEM does not occur at the same intensity at the centers of the first and second blue light-emitting layers 1241 and 1242, but main light emission caused by the host is concentrated at the interface between the first and second blue light-emitting layers 1241 and 1242, as shown in FIG. 4, since the blue light-emitting layers 1241 and 1242 have a common host. Also, auxiliary light emission caused by the hole trapping property of the first blue dopant BD1 in the region of the first blue light-emitting layer 1241 is weak overall in proportion to the dopant content in the first blue light-emitting layer 1241. Accordingly, as shown in FIG. 4, in the first blue light-emitting layer 1241, since auxiliary light emission caused by the first blue dopant BD1 is generated along with main light emission, intensity of which gradually decreases as it moves away from the center of the combined first and second blue light-emitting layers 1241 and 1242, light emission that gradually decreases towards the hole transport layer 1230 is generated as a whole.

For example, as shown in FIG. 4, in the blue light-emitting unit BEM including the first and second blue light-emitting layers 1241 and 1242 that are in contact with each other, an asymmetric distribution of the hole trap region biased toward the first blue light-emitting layer 1241 is generated, and the first blue light-emitting layer 1241 can be completely used for light emission based on such asymmetric distribution compared to a mode in which light is concentrated only on a specific region when a single blue dopant is used. In addition, by lowering the hole transport speed of the hole transport layer compared to the electron speed of the electron transport layer, the exciton formation region can be widened and thus the lifespan of the light-emitting device can be improved. Accordingly, asymmetric light emission between the first blue light-emitting layer 1241 and the second blue light-emitting layer 1242 occurs in the blue light-emitting unit BEM. For example, since most area or the entire area of the first blue light-emitting layer 1241 is used as the emission zone, the second blue light-emitting layer 1242 emits light with the highest intensity at the interface between the second blue light-emitting layer 1242 and the first blue light-emitting layer 1241. Here, the second blue light-emitting layer 1242 can have a region not emitting light immediately adjacent to the electron transport layer 1250 due to the speed at which electrons are transported adjacent to the electron transport layer 1250.

The content of the first and second blue dopants BD1 and BD2 in the entire blue light-emitting unit BEM can be 0.1 wt % to 10 wt %, which can be low, and corresponding to 1/1000 to 1/10 that of the host, for example. Accordingly, most of the holes transported through the hole transport layer 1230 and the electrons transported through the electron transport layer 1250 based on the blue light-emitting unit BEM can be moved through the host BH, which is the main component of the blue light-emitting unit BEM and main light emission is concentrated at the interface between the first and second blue light-emitting layers 1241 and 1242. In this case, since the host BH is present in the entire blue light-emitting unit BEM in both the first and second blue light-emitting layers 1241 and 1242, and holes and electrons move to the center of the blue light-emitting unit BEM that is at or around the interface of the first and second blue light-emitting layers 1241 and 1242 through the host due to the driving current generated by a voltage difference applied between the first and second electrodes 110 and 200, the main light emission can be stronger at the center, but can be weaker as the distance from the center is increased.

In addition, the first blue dopant BD1 of the first blue light-emitting layer 1241 has a hole trapping property due to the higher HOMO energy level compared to the adjacent hole transport layer 1230 and thus traps some holes transported from the hole transport layer 1230 before recombination with electrons inside the blue light-emitting unit (BEM), and auxiliary light emission is generated by combination of electrons not used for exciton formation with holes trapped by the first blue dopant BD1 in the second blue light-emitting layer 1242. As the first blue dopant BD1 can be doped in an amount of 0.1 wt % to 10 wt % in the entire first blue light-emitting layer 1241, auxiliary light emission can be generated in the entire first blue light-emitting layer 1241, but can be weaker than the main light emission due to the difference in the content of the first blue dopant BD1.

However, the light-emitting device of the present disclosure has an advantage of having an increased emission zone compared to the narrow emission area due to the concentration of light emission at the center of the single blue light-emitting layer or the interface between the single blue light-emitting layer and the hole transport layer by utilizing holes trapped by the first blue dopant BD1 in the entire first blue light-emitting layer 1241 and electrons not used in main light emission through the host. In addition, when the electron transport layer 1250 transports electrons to the blue light-emitting unit (BEM) at a high speed due to excellent electron transport ability thereof, and the speed at which holes are transported to the hole transport layer 1230 does not reach the speed of the electrons, electrons not used for light emission through excitation can enter the hole transport layer 1230. The light-emitting device is capable of preventing this phenomenon and uses such electrons for auxiliary light emission in the first blue light-emitting layer 1241, thereby increasing recombination between electrons and holes to improve external quantum efficiency, and preventing accumulation of electrons or excitons at the interface between the blue light-emitting unit (BEM) or the hole transport layer 1230 to improve lifespan.

Meanwhile, the hole transport layer 1230 in contact with the first blue light-emitting layer 1241 has the function to prevent electrons (excitons) from passing through the blue light-emitting unit BEM, in addition to the function to transport holes to the blue light-emitting unit BEM. To this end, the lowest unoccupied molecular orbital (LUMO) energy level of the hole transport layer 1230 in contact with the first blue light-emitting layer 1241 is preferably higher than the LUMO energy level of the first blue light-emitting layer 1241.

The first and second blue dopants BD1 and BD2 in the blue light-emitting unit BEM fall from the LUMO energy level to the HOMO energy level. At this time, excitons are generated. The difference between the LUMO energy level and the HOMO energy level of the first and second blue dopants BD1 and BD2 corresponds to a band gap, and each material has a band gap of about 2.7 eV to 3.0 eV in order to induce blue light emission by the blue light-emitting unit BEM.

For the hole trapping of the first blue dopant BD1 in the first blue light-emitting layer 1241, the HOMO energy level BD1_HOMO of the first blue dopant BD1 can be preferably at least 0.1 eV higher than the HOMO energy level HTL-_HOMO of the hole transport layer 1230. In order to effectively trap holes transported from the hole transport layer 1230 at the HOMO energy level of the first blue dopant BD1 in the first blue light-emitting layer 1241, the HOMO energy level BD1_HOMO of the first blue dopant BD1 preferably has a difference of 1 eV or less from the HOMO energy level (HTL_HOMO) of the hole transport layer 1230. For example, when the HOMO energy level BD1_HOMO of the first blue dopant BD1 is higher than the HOMO energy level HTL_HOMO of the hole transport layer 1230 by more than 1.0 eV, hole trapping may not be effectively generated.

In addition, the HOMO energy level HTL_HOMO of the hole transport layer 120 must be higher than the HOMO energy level of the blue light-emitting unit BEM in order to realize hole transport from the hole transport layer 1230 to the blue light-emitting unit BEM. For example, the relationship between the HOMO energy levels of the materials at the interface between the hole transport layer 1230 and the blue light-emitting unit BEM is as follows: BD1_HOMO>HTL_HOMO>BH_HOMO.

Accordingly, the HOMO energy level BD1_HOMO of the first blue dopant BD1 is preferably at least 0.5 eV higher than the HOMO energy level BH_HOMO of the host BH used in the blue light-emitting unit BEM.

For example, when the HOMO energy level HTL-_HOMO of the hole transport layer 1230 is −5.5 eV to −5.9 eV, the HOMO energy level BD1_HOMO of the first blue dopant BD1 of the first blue light-emitting layer 1241 can correspond to −5.0 eV to −5.4 eV. In this case, the HOMO energy level (BH_HOMO) of the host can be −5.9 eV to −6.3 eV.

Meanwhile, the blue host BH can be a single material or include a plurality of materials. In the light-emitting device of the present disclosure, the first and second blue light-emitting layers 1241 and 1242 are commonly used. In addition, the blue host BH has a larger energy bandgap than the first and second blue dopants BD1 and BD2 in order to transfer energy to the first and second blue dopants BD1 and BD2, and uses a material having an energy bandgap of 3.0 eV or higher.

The blue host (BH) can be any one of an anthracene-based compound, a fluorene-based compound, and a pyrene-based compound. In some cases, the blue host (BH) can further include an arylene-based compound for other transport properties.

Each of the first and second blue dopants BD1 and BD2 has an emission peak at 440 nm to 470 nm and each or one thereof can use a boron-based compound or a pyrene-based compound.

For example, the second blue dopant of the second blue light-emitting layer can include any one of the materials represented by the following Formulas 1 to 9.

[Formula 1]

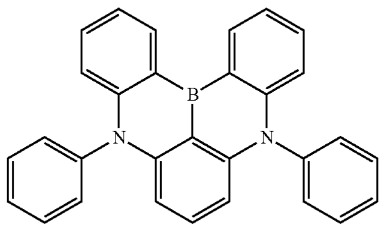

[Formula 2]

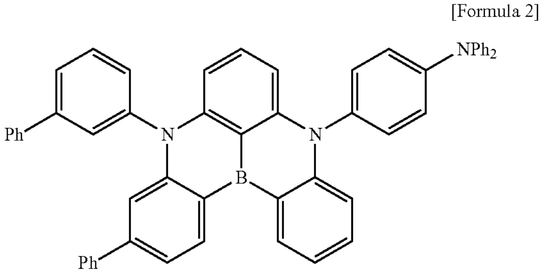

[Formula 3]

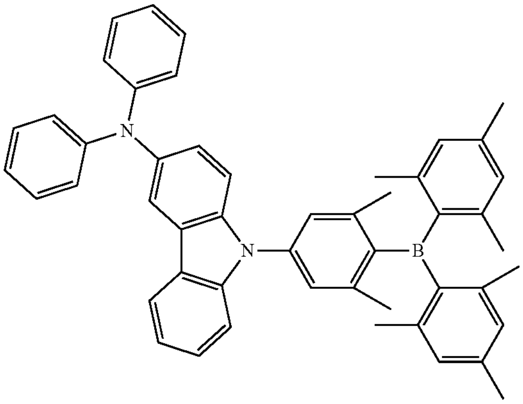

[Formula 4]

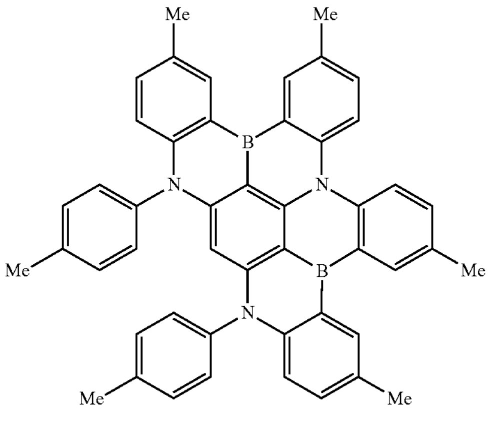

-continued

[Formula 5]

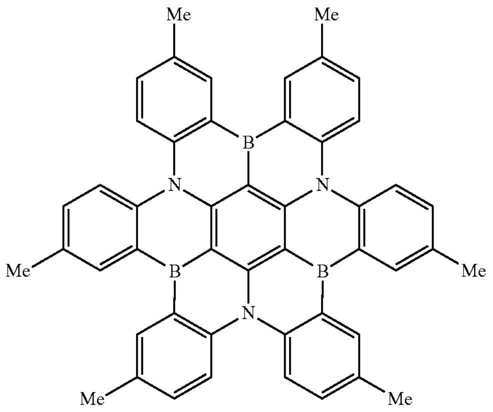

[Formula 6]

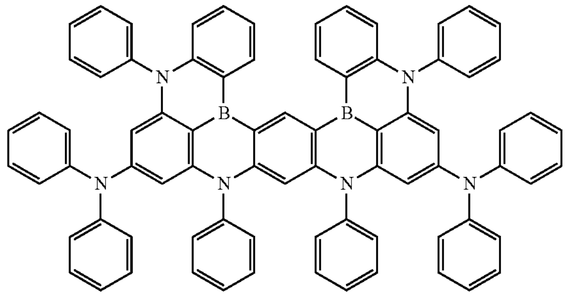

[Formula 7]

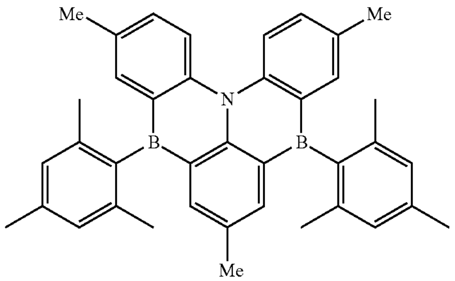

[Formula 8]

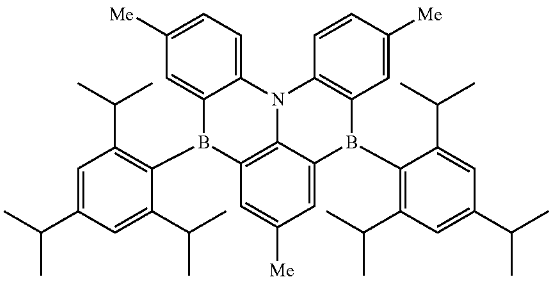

-continued

[Formula 9]

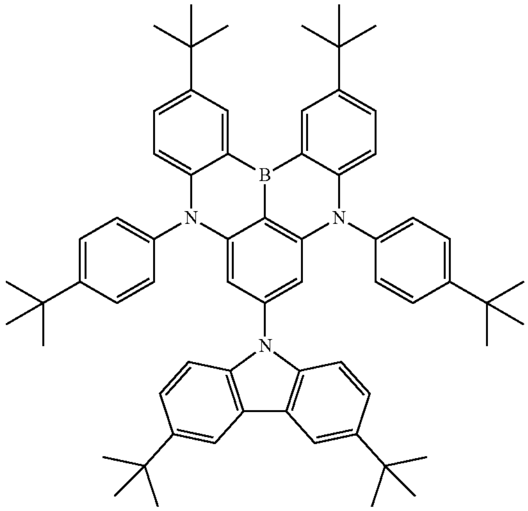

In addition, for example, the first blue dopant BD1 of the first blue light-emitting layer is formed by substituting an end group of any one of the compounds represented by Formulas 1 to 9 by carbazole of Formula 10, acridine of Formula 11, diphenylamine of Formula 12, or dibenzofuran of Formula 13 in order for the first dopant BD1 to have a higher HOMO energy level than the HOMO energy level of the second blue dopant BD2, as follows.

[Formula 10]

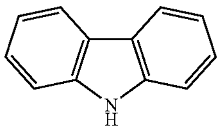

[Formula 11]

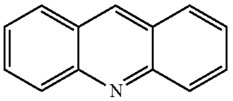

[Formula 12]

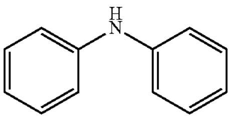

[Formula 13]

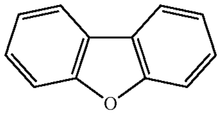

Hereinafter, experiments for evaluating the properties of the first and second blue dopants used in the first and second blue light-emitting layers of the light-emitting device of the present disclosure will be described.

Figure 5:
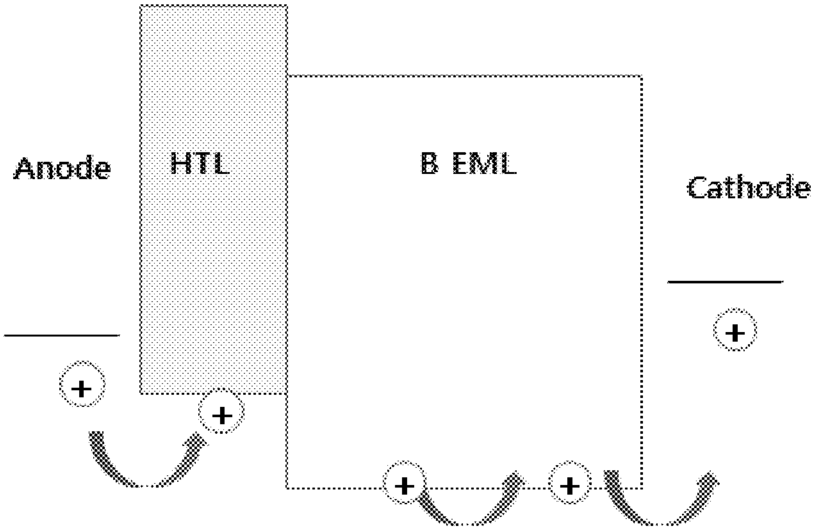
FIG. 5 is an energy band diagram of an HOD device to determine the I-V characteristics of the first and second blue dopants, and illustrates carrier movement in the HOD device.
Figure 6:
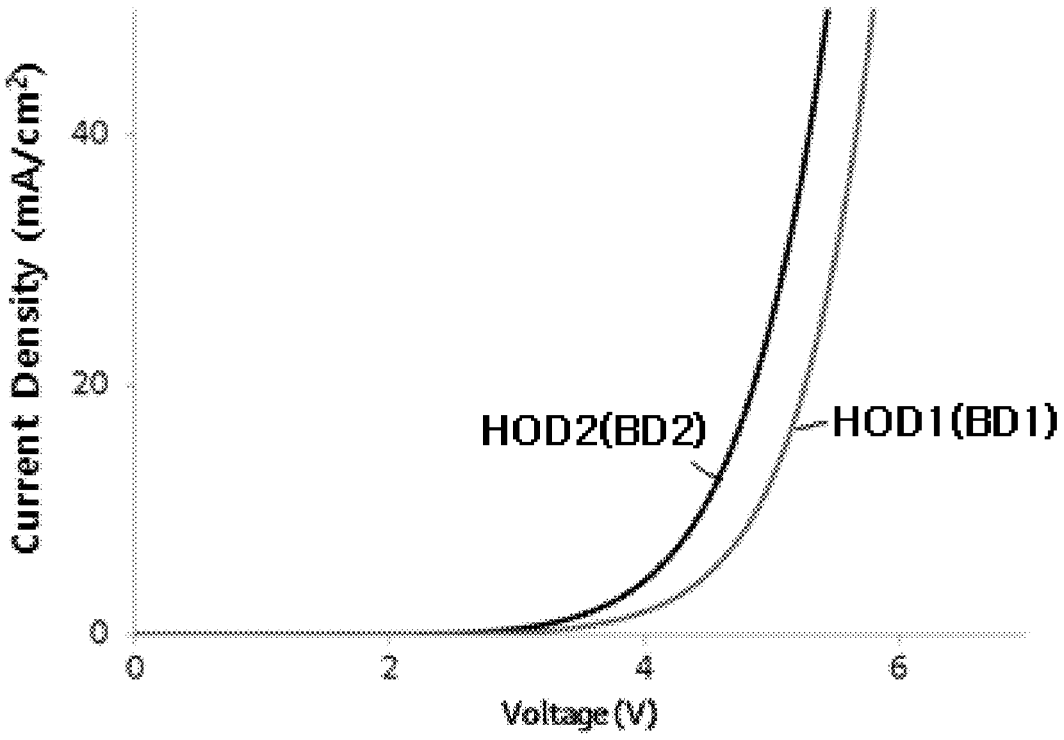
FIG. 6 is a graph illustrating the I-V characteristics of the first and second blue dopants, measured through the HOD device of FIG. 5.

FIG. 5 is an energy band diagram of an HOD device to determine the I-V characteristics of the first and second blue dopants, and illustrates carrier movement in the HOD device. FIG. 6 is a graph illustrating the I-V characteristics of the first and second blue dopants, measured through the HOD device of FIG. 5. FIG. 7 illustrates an emission zone when a single dopant is applied to a blue light-emitting unit.

In order to determine the hole-related characteristics of the first and second blue dopants BD1 and BD2, as shown in FIG. 5, a device only including a hole transport layer HTL and a blue light-emitting layer B EML between an anode and a cathode is formed.

In addition, the blue light-emitting layer BEML can include a common anthracene-based compound, the first blue dopant BD1 can be doped at an equal amount of 2 wt % in the first HOD device HOD1, and the second blue dopant BD2 can be doped at an equal amount of 2 wt % in the second HOD device HOD2. In other embodiments, different amounts of the first blue dopant BD1 and the second blue dopant BD2 can be provided.

As shown in FIG. 6, in view of the driving voltage versus current in each of the first and second HOD devices HOD1 and HOD2, the graph of the first HOD device HOD1 compared to the second HOD device HOD2 shows a J-V shift. This is because the first blue dopant BD1 of the first HOD device HOD1 has a hole trapping property compared to the second blue dopant BD2.

Meanwhile, the second blue dopant BD2 used in the second HOD device HOD2 has relatively excellent J-V characteristics.

However, when a single dopant is used as the second blue dopant BD2 to form a single blue light-emitting layer, holes and electrons supplied from the hole transport layer HTL and the electron transport layer ETL, respectively, recombine with each other in a narrow light-emitting region in the blue light-emitting layer, to emit light. In this case, narrow luminance characteristics are obtained.

Accordingly, in the light-emitting device of the present disclosure, as described with reference to FIGS. 1 to 4, the blue light-emitting unit has a structure of two layers including dopants having different properties from each other, thus widening the distribution of the emission zone of the blue light-emitting unit. The main light emission can be achieved by carrier transport using a host in the entire blue light-emitting unit. In addition, the first blue light-emitting layer in contact with the hole transport layer (or electron blocking layer) is doped with a first blue dopant having a higher HOMO energy level than the HOMO energy level of the adjacent hole transport layer (or electron blocking layer), and thus first blue dopant can trap the holes transported from the hole transport layer (or electron blocking layer). In addition, auxiliary light emission is generated by recombination of the electrons transported without being used for excitation in the second blue light-emitting unit with the holes trapped in the first blue dopant. The auxiliary light emission enables the light-emitting region in the first blue light-emitting layer to be wide enough to be adjacent to the hole transport layer (or electron blocking layer) even when an electron transport layer having high transport capacity is used, increases the recombination rate of carriers in the blue light-emitting unit and thus improves the external quantum efficiency.

In addition, the light-emitting device of the present disclosure improves luminous efficacy due to the increased exciton generation rate in the blue light-emitting layer, prevents electrons from being accumulated in the hole transport layer or electron blocking layer beyond the light-emitting layer, and thereby improves the lifespan of the light-emitting device. In addition, the light-emitting device and a light-emitting display device including the same are capable of improving the lifespan by reducing a factor causing extinction in the blue light-emitting unit.

Various embodiments of the present disclosure will be described.

Figure 7A:
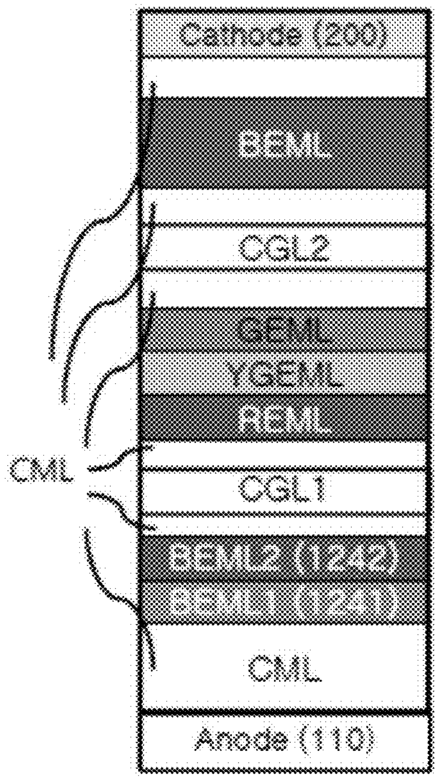
FIGS. 7A to 7C are cross-sectional views of light-emitting devices according to second to fourth embodiments of the present disclosure.
Figure 7B:
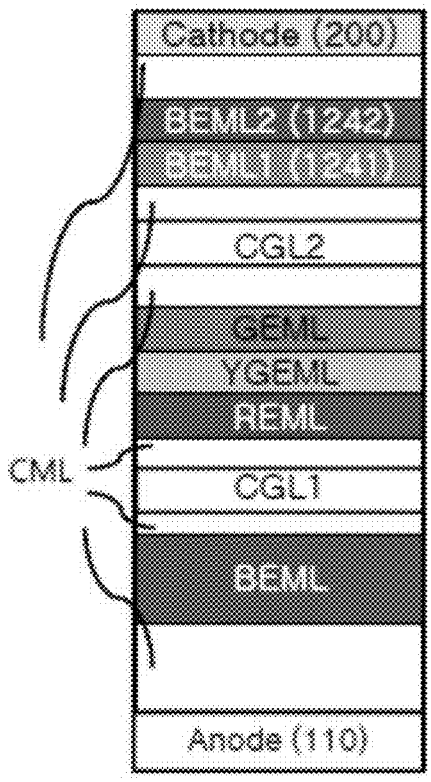
Figure 7C:
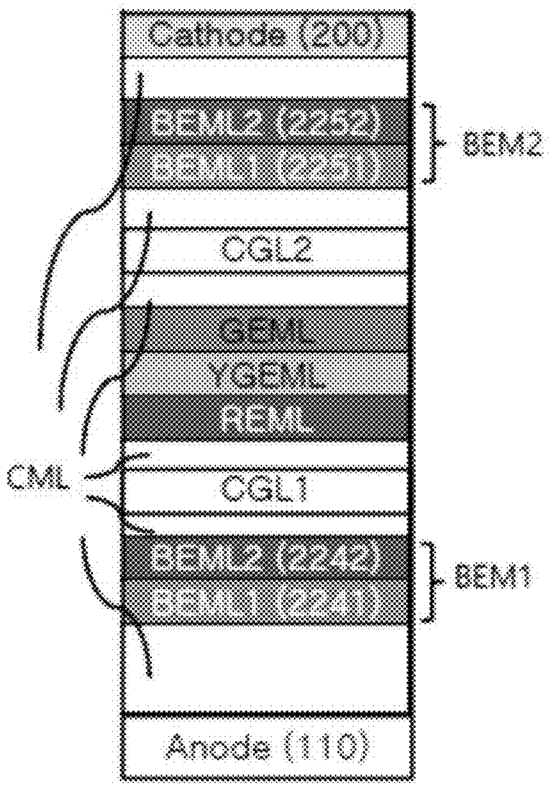

FIGS. 7A to 7C are cross-sectional views of light-emitting devices according to second to fourth embodiments of the present disclosure.

FIGS. 7A to 7C illustrate an example in which a light-emitting device is implemented in a three-stack structure.

As shown in FIGS. 7A to 7C, the stacks of the light-emitting device are separated by charge generation layers CGL1 and CGL2, a phosphorescent stack including a red light-emitting layer (REML), a yellow green light-emitting layer (YGEML) and a green light-emitting layer (GEML) is disposed in the center and other stacks contacting the anode 110 and the cathode 200 are disposed as blue light-emitting stacks.

As shown in FIG. 7A, the light-emitting device according to the second embodiment of the present disclosure includes a blue light-emitting unit of a first blue light-emitting stack in contact with the anode 110 as a double layer structure including first and second blue light-emitting layers 1241 and 1242, and a blue light-emitting unit of a second blue light-emitting stack in contact with the cathode 200 as a single blue light-emitting layer (BEML) structure.

Each first blue light-emitting layer 1241 can include the blue host BH and the first blue dopant BD1 having hole trapping properties described with reference to FIGS. 1 to 4, and the second blue light-emitting layer 1242 and the single-layer blue light-emitting layer BEML can include the second blue dopant BD2 having no hole trapping property.

As shown in FIG. 7B, the light-emitting device according to the third embodiment of the present disclosure includes the blue light-emitting unit of the second blue light-emitting stack in contact with the cathode 200 as a double layer structure including first and second blue light-emitting layers 1241 and 1242, and the blue light-emitting unit of the first blue light-emitting stack in contact with the anode 110 as a single blue light-emitting layer (BEML).

Each first blue light-emitting layer 1241 includes the blue host BH and the first blue dopant BD1 having hole trapping properties described with reference to FIGS. 1 to 4, and the second blue light-emitting layer 1242 and the single-layer blue light-emitting layer BEML use the second blue dopant BD2 having no hole trapping property.

As shown in FIG. 7C, the light-emitting device according to the third embodiment of the present disclosure includes the first blue light-emitting unit BEM1 of the first blue light-emitting stack in contact with the anode 110 as a double layer structure including first and second blue light-emitting layers 2241 and 2242, and the second blue light-emitting unit BEM2 of the second blue light-emitting stack in contact with the cathode 200 as a double layer structure including third and fourth blue light-emitting layers 2251 and 2252.

Each of the first blue light-emitting layer 2241 and the third blue light-emitting layer 2251 includes the blue host BH and the first blue dopant BD1 having hole trapping properties described with reference to FIGS. 1 to 4, and the second blue light-emitting layer 2242 and the fourth blue light-emitting layer 2252 use the second blue dopant BD2 having no hole trapping property.

Meanwhile, a common layer (CML) is provided between the electrode and the light-emitting layer or between the light-emitting layer and the charge generation layer of each stack described above, a common layer close to the anode 110 based on the light-emitting layer is a common layer related to hole transport, and a common layer close to the cathode 200 based on the light-emitting layer is a common layer related to electron transport.

TABLE 1

| Item | | First experimental embodiment (Ex1) | Second embodiment | Third embodiment | Fourth embodiment |
|---|---|---|---|---|---|
| BEM2 | | BEML (w BD2) | BEML ( w BD2) | BEML1 BEML2 | BEML3:BEML 4 |
| BEM1 | | BEML (w BD2) | BEML1:BEML2 | BEML (w BD2) | BEML1:BEML2 |
| Efficiency | R | 100% | 104% | 106% | 100% |
| | G | 100% | 98% | 100% | 102% |
| | B | 100% | 101% | 102% | 101% |
| | W | 100% | 100% | 101% | 101% |
| T95 lifespan | B | 100% | 117% | 115% | 135% |

Table 1 shows the efficiency and T95 lifespan when the first blue light-emitting unit of the first blue stack and the second blue light-emitting unit of the second blue stack that come into contact with the anode and the cathode in a three-stack structure have a single- or double-layered structure.

The efficiency for each color and the T95 lifespan of the first experimental embodiment (Ex1) in which both the first and second blue light-emitting units have a single layer, for example, in which a single blue light-emitting layer including the second blue dopant BD2 as a dopant is formed, are compared with those of the second to fourth embodiments.

Figure 8:
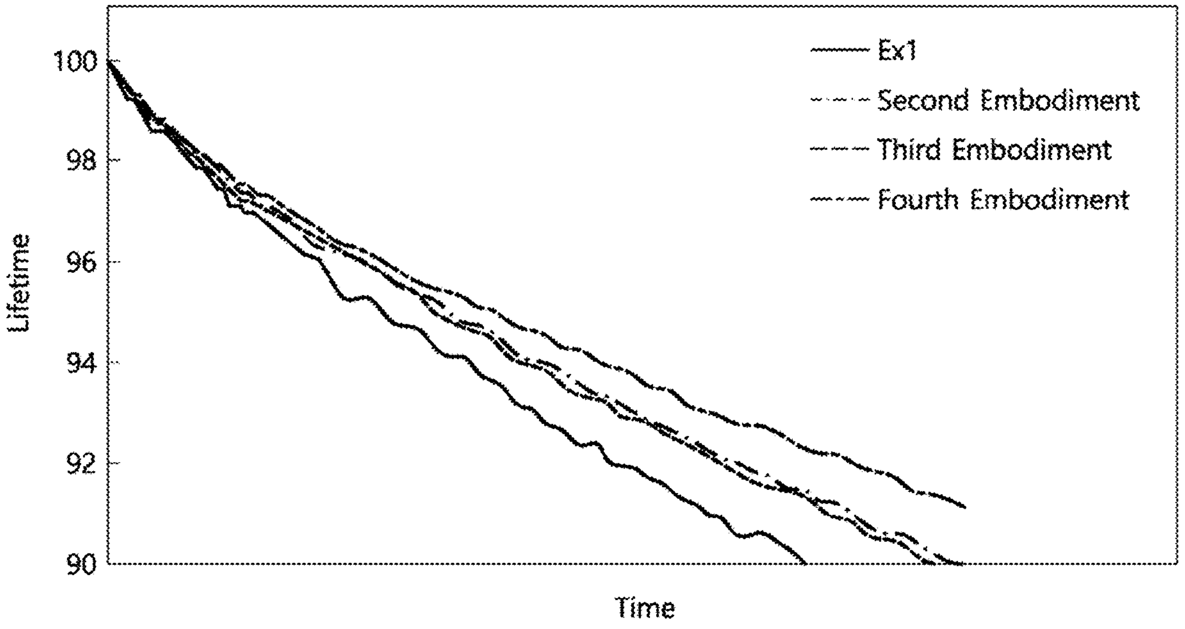
FIG. 8 is a graph illustrating the blue lifespan of a first experimental embodiment and the second to fourth embodiments.

FIG. 8 is a graph showing the blue lifespan of the first experimental embodiment and the second to fourth embodiments.

As shown in FIG. 8 and Table 1, the T95 lifespan is improved in the order of the first experimental embodiment (Ex1), the third embodiment, the second embodiment, and the fourth embodiment, and a structure having more double-layered blue light-emitting units has an effect of further improving the lifespan. Although the difference in lifespan between the third embodiment and the second embodiment is about 2%, both the second and Third embodiments have an effect of improving lifespan by 15% or more compared to the first experimental embodiment (Ex1).

Meanwhile, as can be seen from Table 1, all of red, green, blue, and white efficiencies are improved or have the same level in the second to fourth embodiments.

Therefore, it can be seen from the above experiment that both lifespan and efficiency can be improved when the light-emitting device of the present disclosure is applied.

Figure 9:
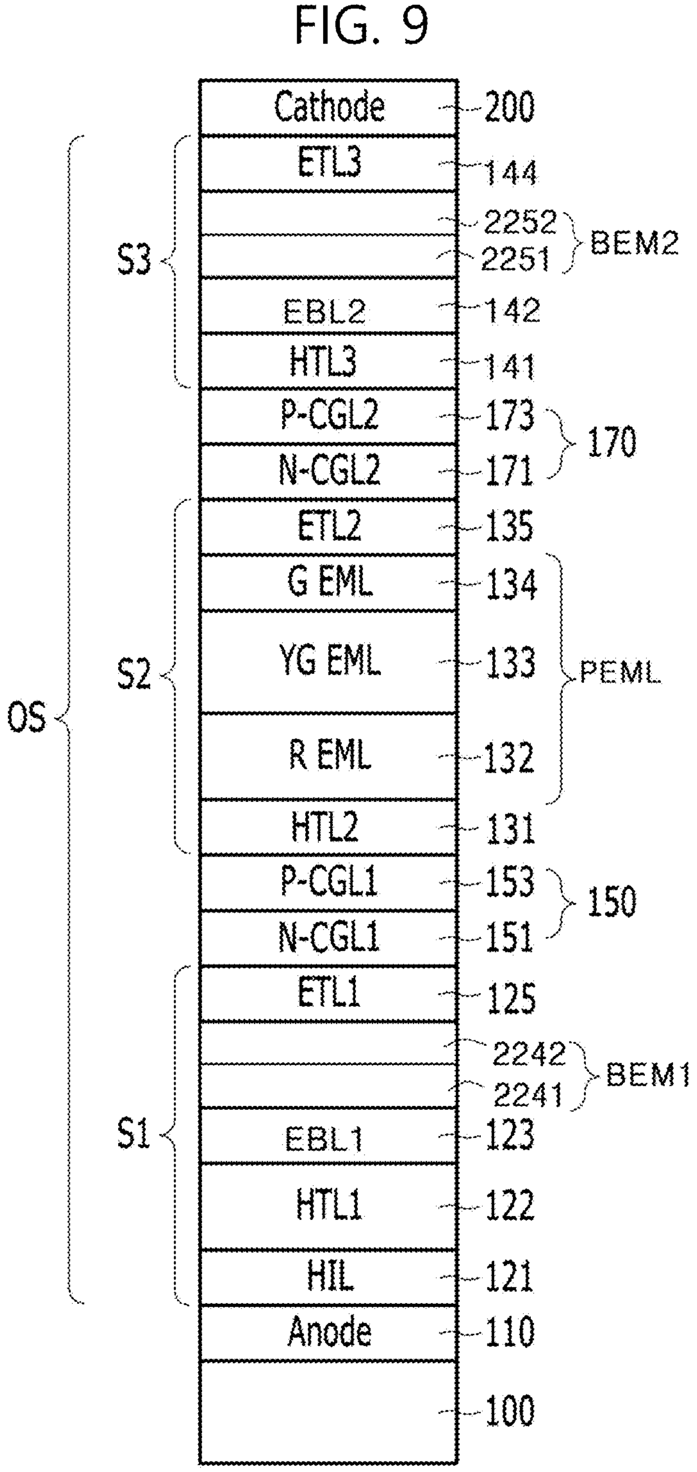
FIG. 9 is a cross-sectional view illustrating a specific example of FIG. 7C.

FIG. 9 is a cross-sectional view illustrating a specific example of FIG. 7C.

FIG. 9 shows an example in which the light-emitting device according to an embodiment of the present disclosure has three stacks S1, S2, and S3 between the anode 110 and the cathode 200. Here, the first to third stacks S1, S2, and S3 are separated by the first and second charge generation layers 150 and 170. The first stack S1 can include a hole injection layer 121, a first hole transport layer 122, an electron blocking layer 123, a first blue light-emitting part BEM1 including first and second blue light-emitting layers described with reference to FIGS. 1 to 4, and a first electron transport layer 125 sequentially stacked between the anode 110 and the first charge generation layer 150. The first blue light-emitting layer 2241 can include a first blue dopant BD1 having a hole trapping property, and the second blue light-emitting layer 2242 can include a second blue dopant BD2 that does not have a hole trapping property and receives energy from a host to induce main light emission.

The second stack S2 is provided between the first and second charge generation layers 150 and 170, and can include a phosphorescent light-emitting layer (PEML) including a red light-emitting layer 132, a yellow-green light-emitting layer 133, and a green light-emitting layer 134 stacked adjacent to one another, a second hole transport layer 131 under the red light-emitting layer 132, and a second electron transport layer 135 on the green light-emitting layer 134. Other layers can be included.

The third stack S3 is provided between the second charge generation layer 170 and the cathode 200, and can include a third hole transport layer 141, a second electron blocking layer 142, a second blue light-emitting unit BEM2 including third and fourth blue light-emitting layers 2251 and 2252, and a third electron transport layer 144 sequentially stacked. The third blue light-emitting layer 2251 can include a first blue dopant BD1 having a hole trapping property, and the fourth blue light-emitting layer 2252 can include a second blue dopant BD2 that does not have a hole trapping property and receives energy from the host to induce main light emission. Other layers can be included.

In addition, the cathode 200 can be formed on the second electron transport layer 144. In some cases, an electron injection layer can be further formed between the second electron transport layer 144 and the cathode 200.

The first and second charge generation layers 150 and 170 between the stacks include n-type charge generation layers 151 and 171 functioning to generate electrons and transfer the electrons to adjacent stacks, and p-type charge generation layers 153 and 173 functioning to generate holes and transfer the holes to adjacent stacks. In some cases, the first and second charge generation layers 150 and 170 can be formed as a single layer by doping at least one host with a combination of an n-type dopant and a p-type dopant.

Figure 10:
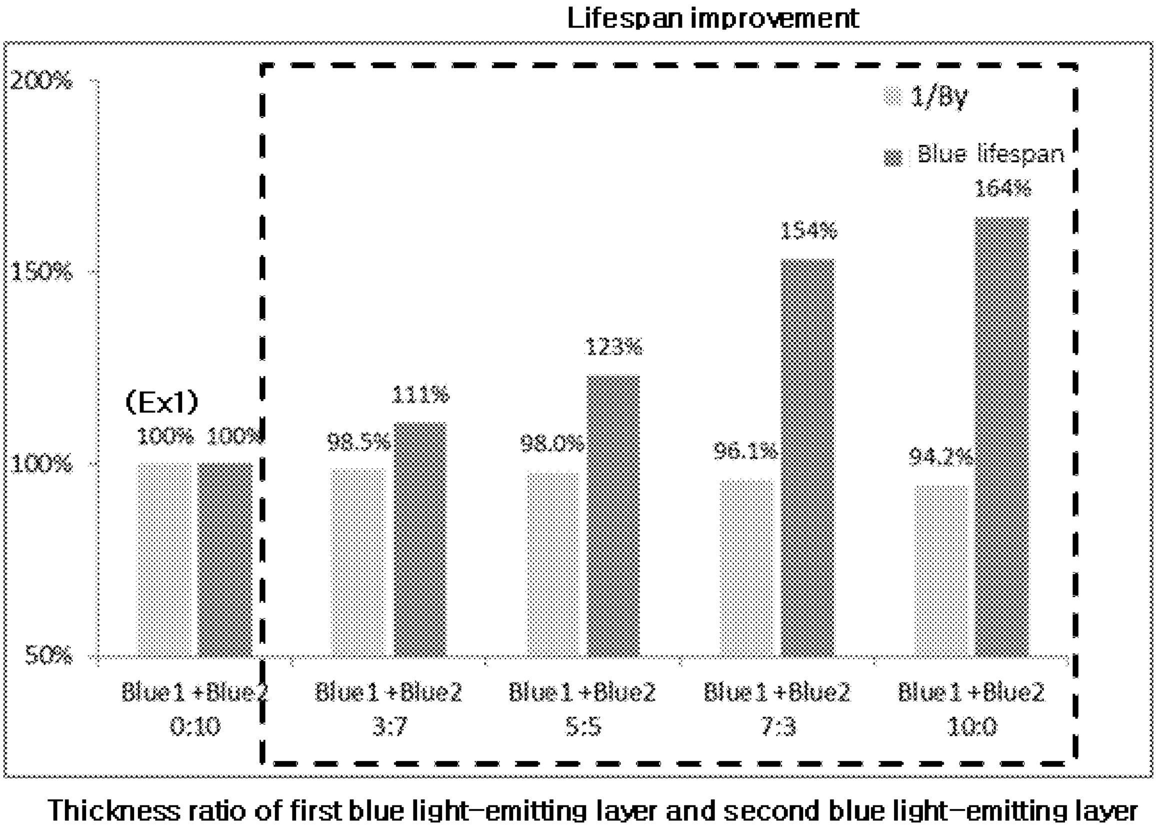
FIG. 10 is a graph showing the 1/By characteristics and lifespan depending on the thickness ratio of the first and second blue light-emitting layers in the blue light-emitting unit in the light-emitting device of the present disclosure.

As described above, in the light-emitting device according to FIG. 10, main light emission is generated at the interface between the first and second blue light-emitting layers 2241 and 2242 due to the movement of the main carriers of the host in the first blue light-emitting unit BEM1, and auxiliary light emission is generated by recombination of electrons and holes transported to the first blue light-emitting layer 2241 through the first hole transport layer 122 and the first electron blocking layer 123 by hole trapping in the first blue dopant BD1 of the first blue light-emitting layer 2241, so light emission can be generated as a combination of main light emission with auxiliary light emission in the entire area of the first blue light-emitting layer 2241 and an emission zone, in which the second blue light-emitting layer 2242 has the highest luminous efficacy at the interface between the first and second blue light-emitting layers 2241 and 2242 and gradually decreases in luminous efficacy toward the first electron transport layer 125, can be widened.

Similarly, main light emission is generated at the interface between the third and fourth blue light-emitting layers 2251 and 2252 due to the movement of the main carriers of the host in the second blue light-emitting part BEM2, and auxiliary light emission is generated by recombination of electrons and holes transported to the third blue light-emitting layer 2251 through the third hole transport layer 141 and the second electron blocking layer 142 by hole trapping in the first blue dopant BD1 of the third blue light-emitting layer 2251, so light emission can be generated as a combination of main light emission with auxiliary light emission in the entire area of the third blue light-emitting layer 2541 and an emission zone, in which the fourth blue light-emitting layer 2252 has the highest luminous efficacy at the interface between the third and fourth blue light-emitting layers 2251 and 2252 and gradually decreases in luminous efficacy toward the third electron transport layer 144, can be widened.

FIG. 10 is a graph showing the 1/By characteristics and lifespan depending on the thickness ratio of the first and second blue light-emitting layers in the blue light-emitting unit in the light-emitting device of the present disclosure.

As can be seen from FIG. 10, when the thickness ratio of the first blue light-emitting layer BEML1 (blue 1) is increased, the lifespan is improved. For example, even when the light-emitting device includes only the first blue light-emitting layer BEML1 having a hole trapping property along with the second blue light-emitting layer BEML that causes main light emission, the lifespan is improved.

Meanwhile, it can be seen that the characteristic of 1/By indicating blue efficiency decreases as the thickness of the first blue light-emitting layer BEML1 increases.

Compared to the first experimental embodiment (Ex1), a normal level of the 1/By characteristic is 95% or more and the 1/By characteristic is within a normal level when the thickness ratio of the first blue light-emitting layer BEML1 to the second blue light-emitting layer BEML2 is up to about 9:1.

Figure 11:
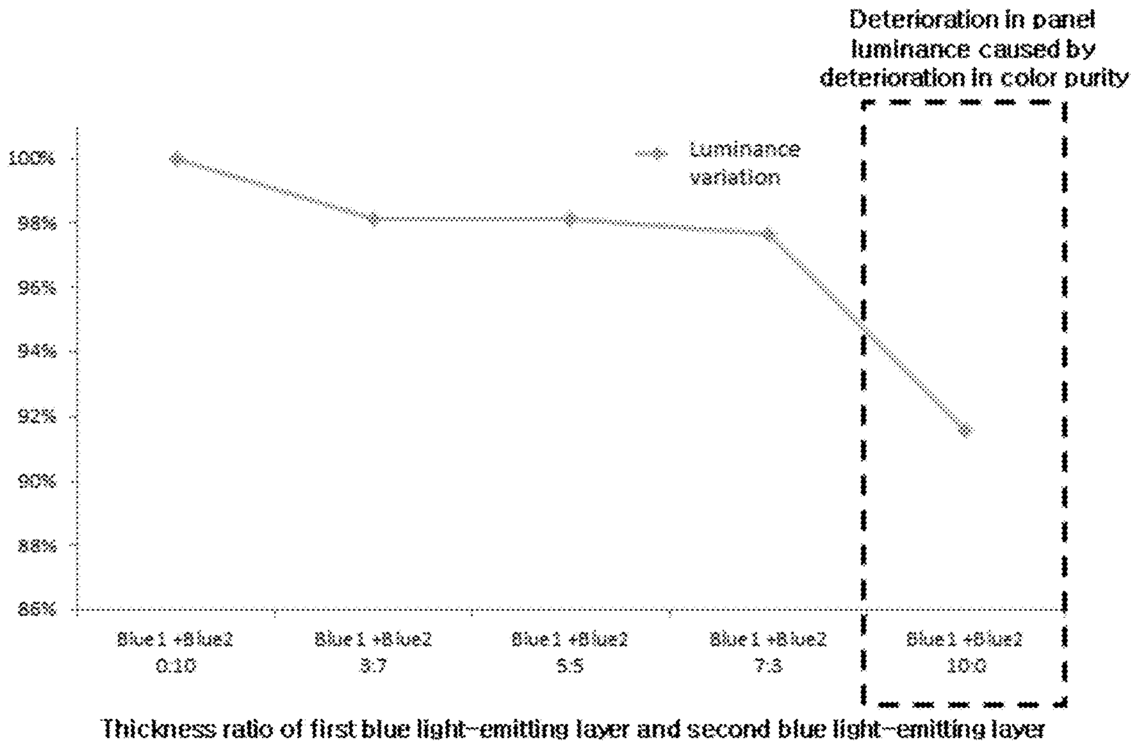
FIG. 11 is a graph illustrating luminance generated depending on the thickness ratio of first and second blue light-emitting layers in a blue light-emitting unit in the light-emitting device of the present disclosure.

FIG. 11 is a graph illustrating luminance generated depending on the thickness ratio of first and second blue light-emitting layers in a blue light-emitting unit in the light-emitting device of the present disclosure.

FIG. 11 shows the result of testing on panel luminance as a function of the 1/By value.

For example, as the thickness ratio of the first and second blue light-emitting layers BEML1 and BEML2 varies from 7:3 to 10:0, luminance decreases linearly. The luminance is approximately 95% up to the thickness ratio of 8:2. When the thickness ratio of the first and second blue light-emitting layers BEML1 and BEML2 in the light-emitting device of the present disclosure falls within the range from 1:9 to 8:2, optionally 1:8 to 8:2, both lifespan and panel efficiency are improved to normal levels or higher.

In embodiments, the thickness of the first blue light-emitting layer BEML1 can be the same or different from the thickness of the second blue light-emitting layer BEML2. IN various embodiments of the present disclosure, the thickness of the first blue light-emitting layer BEML1 can be greater than the thickness of the second blue-emitting layer BEML2.

Meanwhile, the number of stacks of the light-emitting device of the present disclosure is not limited to two or three and can be four or more. For example, in the structure of FIG. 10, an additional stack can be provided between the third stack S3 and the cathode 200. In this case, the additional stack has the same structure as the blue stack described with reference to FIGS. 1 to 4.

Hereinafter, a light-emitting display device using the light-emitting device according to one or more embodiments of the present disclosure will be described.

Figure 12:
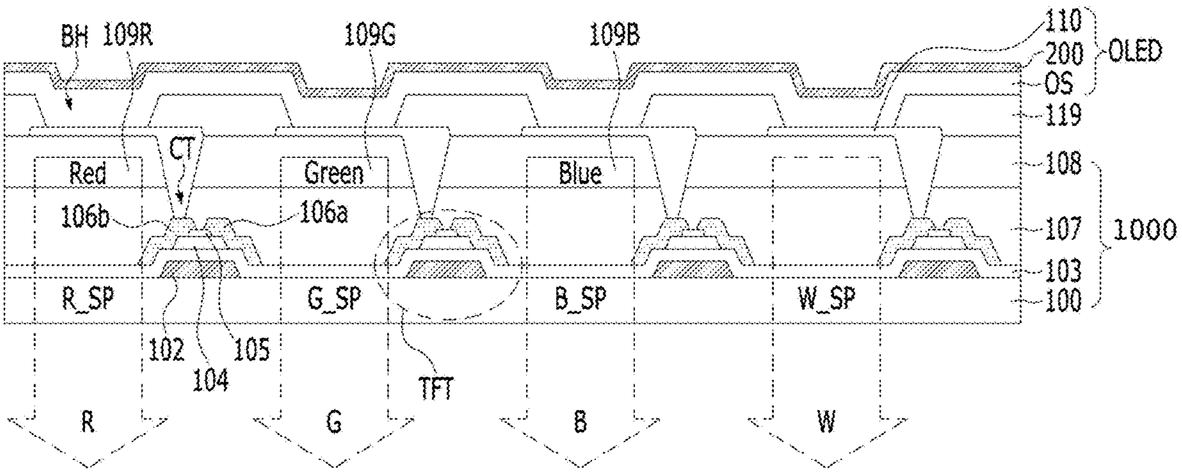
FIG. 12 is a sectional view illustrating a light-emitting display device using the light-emitting device according to the present disclosure.

FIG. 12 is a sectional view illustrating the light-emitting display device using the light-emitting device according to the present disclosure.

Meanwhile, the light-emitting device can be commonly applied to a plurality of subpixels to emit white light to a light-emitting electrode.

As shown in FIG. 12, the light-emitting display device of the present disclosure includes a substrate 100 having a plurality of subpixels R_SP, G_SP, B_SP, and W_SP, a light-emitting device (also referred to as an "OLED" or "organic light-emitting diode") commonly provided on the substrate 100, a thin film transistor (TFT) provided in each of the subpixels and connected to the first electrode 110 of the light-emitting device (OLED), and a color filter layer 109R, 109G, or 109B provided below the first electrode 110 of at least one of the subpixels.

The present example relates to a configuration including the white subpixel W_SP, but the present disclosure is not limited thereto. A configuration in which the white subpixel W_SP is omitted and only the red, green, and blue subpixels R_SP, G_SP, and B_SP are provided is also possible. In some cases, a combination of a cyan subpixel, a magenta subpixel, and a yellow subpixel capable of creating white can be used instead of the red, green, and blue subpixels.

The thin film transistor TFT includes, for example, a gate electrode 102 and a semiconductor layer 104, and a source electrode **106*a* and a drain electrode 106*b* connected to respective sides of the semiconductor layer 104. In addition, a channel passivation layer 105 can be further provided on the portion where the channel of the semiconductor layer 104 is located in order to prevent direct connection between the source/drain electrodes 106*a* and 106*b* and the semiconductor layer 104**.

A gate insulating layer 103 is provided between the gate electrode 102 and the semiconductor layer 104.

The semiconductor layer 104 can be formed of, for example, an oxide semiconductor, amorphous silicon, polycrystalline silicon, or a combination thereof. For example, when the semiconductor layer 104 is an oxide semiconductor, the heating temperature required to form the thin film transistor can be lowered, and thus the substrate 100 can be selected from among a greater variety of available types thereof, so the semiconductor layer 104 can be advantageously applied to a flexible display.

In addition, the drain electrode **106*b* of the thin film transistor TFT can be connected to the first electrode 110 in a contact hole CT formed in the first and second passivation layers 107 and 108**.

The first passivation layer 107 is provided to primarily protect the thin film transistor TFT, and color filters 109R, 109G, and 109B can be provided thereon.

When the plurality of subpixels includes a red subpixel, a green subpixel, a blue subpixel, and a white subpixel, the color filter can include first to third color filters in each of the remaining subpixels 109R, 109G, and 109B, excluding the white subpixel W_SP, and can allow the emitted white light to pass through the anode 110 for each wavelength. A second passivation layer 108 is formed under the anode 110 to overlay the first to third color filters 109R, 109G, and 109B. The anode 110 is formed on the surface of the second passivation layer 108, excluding the contact hole CT.

Here, the configuration including the substrate 100, the thin film transistor TFT, color filters 109R, 109G, and 109B, and the first and second passivation layers 107 and 108 is referred to as a "thin film transistor array substrate" 1000.

The light-emitting device OLED is formed on the thin film transistor array substrate 100 including a bank 119 defining a light-emitting unit BH. The light-emitting device (OLED), for example, includes a transparent anode 110, a cathode 200 of a reflective electrode facing the anode 110, and an electron transporting and blocking unit (ETBU) including an electron blocking layer 123 including an electron blocking material represented by Formula 2, a blue light-emitting layer 124 including a boron-based blue dopant, and an electron transporting layer 125 including an electron transporting material represented by Formula 1 in blue light-emitting stacks S1 and S3 among stacks divided by the first and second charge generation layers CGL1 and CGL2, between the anode 110 and the cathode 200, as described with reference to FIGS. 1A to 2 and 5.

The anode 110 is divided for each subpixel, and the remaining layers of the white-light-emitting device OLED are integrally provided in the entire display area, rather than being divided into individual subpixels.

Meanwhile, each light-emitting device OLED including an internal stack OS between the anode 110 and the cathode 200 can include the structure of the light-emitting device described with reference to FIGS. 1 to 4, or the structure of the light-emitting device used in FIG. 10.

The light-emitting device and the light-emitting display device including the same according to one or more embodiments of the present disclosure have the following advantages and effects.

For example, the blue light-emitting unit has a structure of two layers including dopants having different properties from each other, thus widening the distribution of the emission zone of the blue light-emitting unit. The main light emission can be achieved by carrier transport using a host in the entire blue light-emitting unit. In addition, the first blue light-emitting layer in contact with the hole transport layer (or electron blocking layer) is doped with a first blue dopant having a higher HOMO energy level than the HOMO energy level of the adjacent hole transport layer (or electron blocking layer), and thus first blue dopant can trap the holes transported from the hole transport layer (or electron blocking layer).

In addition, auxiliary light emission is generated by recombination of the electrons transported without being used for excitation in the second blue light-emitting unit with the holes trapped in the first blue dopant. The auxiliary light emission enables the light-emitting region in the first blue light-emitting layer to be wide enough to be adjacent to the hole transport layer (or electron blocking layer) even when an electron transport layer having high transport capacity is used, increases the recombination rate of carriers in the blue light-emitting unit and thus improves the external quantum efficiency.

In addition, the light-emitting device of the present disclosure improves luminous efficacy due to the increased exciton generation rate in the blue light-emitting layer, prevents electrons from being accumulated in the hole transport layer or electron blocking layer beyond the light-emitting layer, and thereby improves the lifespan of the light-emitting device. In addition, the light-emitting device and a light-emitting display device including the same are capable of improving the lifespan by reducing a factor causing extinction in the blue light-emitting unit.

A light-emitting device according to one aspect of the present disclosure can comprise a first electrode and a second electrode facing each other over a substrate and a first blue stack, and a first charge generation layer between the first electrode and the second electrode. The first blue stack may comprise a first hole transport layer, a first blue light-emitting layer, a second blue light-emitting layer, and a first electron transport layer sequentially arranged between the first electrode and the second electrode. The first and second blue light-emitting layers may comprise a same first host. The first blue light-emitting layer may comprise a first blue dopant. The second blue light-emitting layer may comprise a second blue dopant different from the first blue dopant. The first blue dopant has a higher highest occupied molecular orbital (HOMO) energy level than a HOMO energy level of the first hole transport layer.

A light-emitting device according to one aspect of the present disclosure can comprise a first electrode and a second electrode facing each other over a substrate and a first blue stack, a first charge generation layer, and a phosphorescent stack between the first electrode and the second electrode. The first blue stack can sequentially comprise a hole transport layer, a first blue light-emitting layer, a second blue light-emitting layer, and an electron transport layer, the first and second blue light-emitting layers can comprise the same host BH and can comprise different first and second blue dopants, respectively, and the first blue dopant has a higher HOMO energy level than a HOMO energy level of the hole transport layer.

In a light-emitting device according to one aspect of the present disclosure, the HOMO energy level of the hole transport layer can be between a HOMO energy level of the host and the HOMO energy level of the first blue dopant.

In a light-emitting device according to one aspect of the present disclosure, the HOMO energy level of the first blue dopant can be at least 0.1 eV higher than the HOMO energy level of the hole transport layer, and the HOMO energy level of the host can be at least 0.5 eV lower than the HOMO energy level of the first blue dopant.

In a light-emitting device according to one aspect of the present disclosure, a thickness ratio of the first blue light-emitting layer to the second blue light-emitting layer can be 1:9 to 8:2, optionally 1:8 to 8:2.

A light-emitting device according to one aspect of the present disclosure can further comprise a phosphorescent stack and the phosphorescent stack can comprise a red light-emitting layer, a yellow-green light-emitting layer and a green light-emitting layer adjacent to the first charge generation layer.

A light-emitting device according to one aspect of the present disclosure, can further comprise at least one second blue stack between the first charge generation layer and the second electrode.

In a light-emitting device according to one aspect of the present disclosure, the second blue stack can comprise a second hole transport layer, a third blue light-emitting layer, a fourth blue light-emitting layer, and a second electron transport layer sequentially arranged between the first charge generation layer and the second electrode. The third and fourth blue light-emitting layers can comprise the same second host. The third blue light-emitting layer can comprise a third blue dopant, and the fourth blue light-emitting layer can comprise a fourth blue dopant different from the third blue dopant. The third blue dopant can have a higher Highest Occupied Molecular Orbital energy level than a Highest Occupied Molecular Orbital energy level of the second hole transport layer.

In a light-emitting device according to one aspect of the present disclosure, the second blue stack can sequentially comprise the same hole transport layer, the same first blue light-emitting layer, the same second blue light-emitting layer, and the same electron transport layer as those of the first blue stack.

In a light-emitting device according to one aspect of the present disclosure, each of the first blue light-emitting layer and the second blue light-emitting layer can have an emission peak of 440 nm to 470 nm.

In a light-emitting device according to one aspect of the present disclosure, the first blue dopant can be present in an amount of 0.1 wt % to 10 wt % in the first blue light-emitting layer, and the second blue dopant can be present in an amount of 0.1 wt % to 10 wt % in the second blue light-emitting layer. Such amount can further include any value between about 0.1 wt % to 10 wt %, inclusive.

In a light-emitting device according to one aspect of the present disclosure, an asymmetric hole trap region biased toward the first blue light-emitting layer can be generated in the first blue light-emitting layer and the second blue light-emitting layer in contact with each other.

In a light-emitting device according to another aspect of the present disclosure can comprise a first electrode and a second electrode facing each other over a substrate and a first blue stack, a first charge generation layer, a phosphorescent stack and a second blue stack between the first electrode and the second electrode. The first blue stack sequentially comprises a first hole transport layer, a first blue light-emitting unit, and a first electron transport layer, the second blue stack sequentially comprises a second hole transport layer, a second blue light-emitting unit, and a second electron transport layer, at least one of the first and second blue light-emitting units comprises first and second blue light-emitting layers, and the first and second blue light-emitting layers comprise the same host BH and comprise different first and second blue dopants, respectively, and the first blue dopant has a higher HOMO energy level than a HOMO energy level of the first hole transport layer or the second hole transport layer.

In the light-emitting device, the HOMO energy level of the first blue dopant can be at least 0.1 eV higher than the HOMO energy level of the first hole transport layer or the second hole transport layer, and the HOMO energy level of the host is at least 0.5 eV lower than the HOMO energy level of the first blue dopant.

In the light-emitting device, an asymmetric hole trap region biased toward the first blue light-emitting layer is generated in the first blue light-emitting layer and the second blue light-emitting layer coming into contact with each other.

In the light-emitting device, a thickness ratio of the first blue light-emitting layer to the second blue light-emitting layer is 1:9 to 8:2, optionally 1:8 to 8:2.

In the light-emitting device, the phosphorescent stack comprises a red light-emitting layer, a yellow-green light-emitting layer and a green light-emitting layer adjacent to the first charge generation layer.

A display device according to one aspect of the present disclosure can comprise a substrate comprising a plurality of subpixels, a thin film transistor provided in each of the subpixels on the substrate and the light-emitting device as stated above, connected to the thin film transistor in at least one of the subpixels.

It will be apparent to those skilled in the art that various modifications and variations can be made in the present disclosure without departing from the spirit or scope of the disclosure. Thus, it is intended that the present disclosure includes such modifications and variations thereto, provided they fall within the scope of the appended claims and their equivalents.

What is claimed is:

1. A light-emitting device comprising:

a first electrode and a second electrode facing each other over a substrate; and a first blue stack, and a first charge generation layer between the first electrode and the second electrode, wherein, the first blue stack comprises a first hole transport layer including an arylene-based material, a first blue light-emitting layer, a second blue light-emitting layer, and a first electron transport layer sequentially arranged between the first electrode and the second electrode, the first and second blue light-emitting layers comprise a same first host, the first blue light-emitting layer comprises a first blue dopant and the second blue light-emitting layer comprises a second blue dopant different from the first blue dopant, the first blue dopant has a higher highest occupied molecular orbital (HOMO) energy level than a HOMO energy level of the first hole transport layer, and the first blue light-emitting layer and the second blue light-emitting layer are in contact with each other and include an asymmetric hole trap region biased toward the first blue light-emitting layer.

2. The light-emitting device according to claim 1, wherein the HOMO energy level of the first hole transport layer is between a HOMO energy level of the first host and the HOMO energy level of the first blue dopant.

3. The light-emitting device according to claim 2, wherein the HOMO energy level of the first blue dopant is at least 0.1 eV higher than the HOMO energy level of the first hole transport layer, and wherein the HOMO energy level of the same first host is at least 0.5 eV lower than the HOMO energy level of the first blue dopant.

4. The light-emitting device according to claim 1, wherein a thickness ratio of the first blue light-emitting layer to the second blue light-emitting layer is 1:9 to 8:2.

5. The light-emitting device according to claim 1, further comprising a phosphorescent stack between the first electrode and the second electrode, wherein the phosphorescent stack comprises a red light-emitting layer, a yellow-green light-emitting layer and a green light-emitting layer and is adjacent to the first charge generation layer.

6. The light-emitting device according to claim 1, further comprising:

a second blue stack between the first charge generation layer and the second electrode.

7. The light-emitting device according to claim 6, wherein the second blue stack sequentially comprises a second hole transport layer, a third blue light-emitting layer, a fourth blue light-emitting layer, and a second electron transport layer sequentially arranged between the first charge generation layer and the second electrode, and wherein the third and fourth blue light-emitting layers comprise a same second host, the third blue light-emitting layer comprises a third blue dopant, and the fourth blue light-emitting layer comprises a fourth blue dopant different from the third blue dopant, and the third blue dopant has a higher Highest Occupied Molecular Orbital energy level than a Highest Occupied Molecular Orbital energy level of the second hole transport layer.

8. The light-emitting device according to claim 1, wherein each of the first blue light-emitting layer and the second blue light-emitting layer has an emission peak of 440 nm to 470 nm.

9. The light-emitting device according to claim 1, wherein the first blue dopant is present in an amount of 0.1 wt % to 10 wt % in the first blue light-emitting layer, and wherein the second blue dopant is present in an amount of 0.1 wt % to 10 wt % in the second blue light-emitting layer.

10. The light-emitting device according to claim 1, wherein a thickness of the first blue light-emitting layer is different from a thickness of the second blue light-emitting layer.

11. The light-emitting device according to claim 10, wherein the thickness of the first blue light-emitting layer is greater than the thickness of the second blue-light-emitting layer.

12. A light-emitting device comprising:

a first electrode and a second electrode facing each other over a substrate; and a first blue stack, a first charge generation layer, a phosphorescent stack and a second blue stack between the first electrode and the second electrode, wherein, the first blue stack sequentially comprises a first hole transport layer including an arylene-based material, a first blue light-emitting unit, and a first electron transport layer, the second blue stack sequentially comprises a second hole transport layer, a second blue light-emitting unit, and a second electron transport layer, at least one of the first and second blue light-emitting units comprises first and second blue light-emitting layers, and the first and second blue light-emitting layers comprise a same host and comprise different first and second blue dopants, respectively, the first blue light-emitting layer and the second blue light-emitting layer are in contact with each other and include an asymmetric hole trap region biased toward the first blue light-emitting layer, and the first blue dopant has a higher highest occupied molecular orbital (HOMO) energy level than a HOMO energy level of the first hole transport layer or the second hole transport layer.

13. The light-emitting device according to claim 12, wherein the HOMO energy level of the first blue dopant is at least 0.1 eV higher than the HOMO energy level of the first hole transport layer or the second hole transport layer, and the HOMO energy level of the host is at least 0.5 eV lower than the HOMO energy level of the first blue dopant.

14. The light-emitting device according to claim 12, wherein a thickness ratio of the first blue light-emitting layer to the second blue light-emitting layer is 1:9 to 8:2.

15. The light-emitting device according to claim 12, wherein the phosphorescent stack is adjacent to the first charge generation layer, and comprises a red light-emitting layer, a yellow-green light-emitting layer and a green light-emitting layer.

16. A light-emitting display device comprising:

the light-emitting device according to claim 1;

the substrate comprising a plurality of subpixels; and a thin film transistor provided in each of the subpixels over the substrate, wherein the light-emitting device is connected to the thin film transistor in at least one of the subpixels.

17. A light-emitting device comprising:

a first electrode and a second electrode facing each other on a substrate; and a first blue stack, a first charge generation layer, and a phosphorescent stack between the first electrode and the second electrode, wherein, the first blue stack sequentially comprises a hole transport layer including an arylene-based material, a first blue light-emitting layer, a second blue light-emitting layer, and an electron transport layer, a main emission of a blue light is emitted from a region including an interface between the first blue light-emitting layer and the second blue light-emitting layer, an auxiliary emission of the blue light is emitted from a region in the first blue light-emitting layer, and the first blue light-emitting layer and the second blue light-emitting layer are in contact with each other and include an asymmetric hole trap region biased toward the first blue light-emitting layer.

18. The light-emitting device according to claim 17, wherein the first and second blue light-emitting layers comprise a same host, and comprise different first and second blue dopants, respectively, the first blue dopant has a higher highest occupied molecular orbital (HOMO) energy level than a HOMO energy level of the hole transport layer, and a thickness of the first blue light-emitting layer is greater than a thickness of the second blue light-emitting layer.

* * * * *